US012804931B2

(12) United States Patent
Lin et al.

(10) Patent No.: US 12,804,931 B2
(45) Date of Patent: Nov. 17, 2026

(54) METHOD FOR FORMING SEMICONDUCTOR STRUCTURE

(71) Applicant: Vanguard International Semiconductor Corporation, Hsinchu (TW)

(72) Inventors: Yung-Fong Lin, Taoyuan City (TW); Kwang-Ming Lin, Taichung City (TW); Li-Wen Chuang, Taoyuan City (TW); Tsung-Hsiang Lin, New Taipei City (TW); Ting-En Hsieh, New Taipei City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 372 days.

(21) Appl. No.: 18/493,317

(22) Filed: Oct. 24, 2023

(65) Prior Publication Data

US 2025/0133758 A1 Apr. 24, 2025

(51) Int. Cl.
*H10D 30/01* (2025.01)
*H10D 64/01* (2025.01)

(52) U.S. Cl.
CPC ........... *H10D 30/015* (2025.01); *H10D 64/01* (2025.01)

(58) Field of Classification Search
CPC ............................. H10D 64/01; H10D 30/015
See application file for complete search history.

(56) References Cited

U.S. PATENT DOCUMENTS

2021/0043750 A1* 2/2021 Neufeld ............. H10D 62/8503
2021/0184010 A1* 6/2021 Chong ................. H10D 30/475
2022/0336600 A1* 10/2022 Liu ...................... H10D 64/512

FOREIGN PATENT DOCUMENTS

CN 206059396 U 3/2017
CN 115552631 A 12/2022
TW 1726316 B 5/2021

OTHER PUBLICATIONS

Taiwanese Office Action and Search Report for Taiwanese Application No. 112129683, dated Oct. 8, 2024.
Taiwanese Office Action and Search Report for Taiwanese Application No. 112129683, dated Mar. 22, 2024.

* cited by examiner

*Primary Examiner* — Douglas M Menz
(74) *Attorney, Agent, or Firm* — Birch, Stewart, Kolasch & Birch, LLP

(57) ABSTRACT

A method for forming a semiconductor structure is provided. The method includes forming a second semiconductor layer on a first semiconductor layer. The first semiconductor layer and the second semiconductor layer have different energy bandgaps. The method further includes performing an etching process to form an opening exposing a first vertical sidewall of the first semiconductor layer and a second vertical sidewall of the second semiconductor layer. The method further includes forming an electrode structure in the opening to cover the first vertical sidewall and the second vertical sidewall.

17 Claims, 3 Drawing Sheets

METHOD FOR FORMING SEMICONDUCTOR STRUCTURE

BACKGROUND

Technical Field

The present disclosure relates to a method for forming a semiconductor structure, and in particular it relates to a method for forming a semiconductor structure of a high electron mobility transistor (HEMT).

Description of the Related Art

GaN-based semiconductor materials have many excellent material properties, such as high heat-resistance, wide band-gaps, and high electron saturation rates. Therefore, gallium nitride-based semiconductor materials are suitable for use in high-speed applications and high-temperature operating environments. In recent years, gallium nitride-based semiconductor materials have been widely applied in light-emitting diode (LED) elements and high-frequency elements, such as high electron mobility transistors (HEMTs) with heterogeneous interface structures.

On-resistance ($R_{on}$) is an important factor affecting the power consumption of a semiconductor device, and its resistance value is proportional to the power consumption of the semiconductor device. The on-resistance includes the channel resistance of the channel layer and the contact resistance ($R_C$) between the channel layer and the source/drain. Since the high electron mobility transistor (HEMT) includes a two-dimensional electron gas (2DEG) with high electron mobility and high carrier density formed on the heterogeneous interface, the high electron mobility transistor (HEMT) elements have lower channel resistance. Therefore, the on-resistance of a high electron mobility transistor (HEMT) element mainly depends on the contact resistance between the channel layer and the source/drain.

With the development of gallium nitride-based semiconductor materials, these semiconductor devices using gallium nitride-based semiconductor materials are applied in more severe working environments, such as higher frequency, higher temperature or higher voltage environments. Therefore, the manufacturing conditions of semiconductor devices having gallium nitride-based semiconductor materials also face many new challenges. For example, in the conventional high electron mobility transistor (HEMT) manufacturing process, a portion of the thin aluminum gallium nitride (Al—GaN) layer is retained during the etching process, and the metal material for the source/drain is deposited in the openings over the aluminum gallium nitride layer. In this example, high temperatures are used to melt metal so that it penetrates the aluminum gallium nitride layer, thereby turning on a high electron mobility transistor (HEMT). However, the high-temperature process will cause metal flow, which is not beneficial to subsequent processes, and the remaining thickness of the aluminum gallium nitride layer is hard to control. In addition, if the remaining thickness is too thick, the temperature and heating time used for turning on will increase significantly.

In other examples of the conventional high electron mobility transistor (HEMT) manufacturing process, the etching process is performed until the aluminum gallium nitride layer is penetrated, therefore the consideration for controlling the remaining thickness of the aluminum gallium nitride layer is unnecessary. In these examples, the interface profile of the ohmic contact between the subsequently deposited metal material for the source/drain and the two-dimensional electron gas beneath the aluminum gallium nitride layer becomes critical. In the currently known high electron mobility transistor (HEMT) structure, since the contact resistance between the source/drain electrode and the two-dimensional electron gas is still large and difficult to control, there is still room for improvement in the performance of the resulted high electron mobility transistor (HEMT) structures.

BRIEF SUMMARY

The present disclosure provides a method for forming a semiconductor structure. The method includes forming a second semiconductor layer on a first semiconductor layer. The first semiconductor layer and the second semiconductor layer have different energy bandgaps. The method further includes performing an etching process to form an opening exposing a first vertical sidewall of the first semiconductor layer and a second vertical sidewall of the second semiconductor layer. The method further includes forming an electrode structure in the opening to cover the first vertical sidewall and the second vertical sidewall.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion

DETAILED DESCRIPTION

Figure 1:
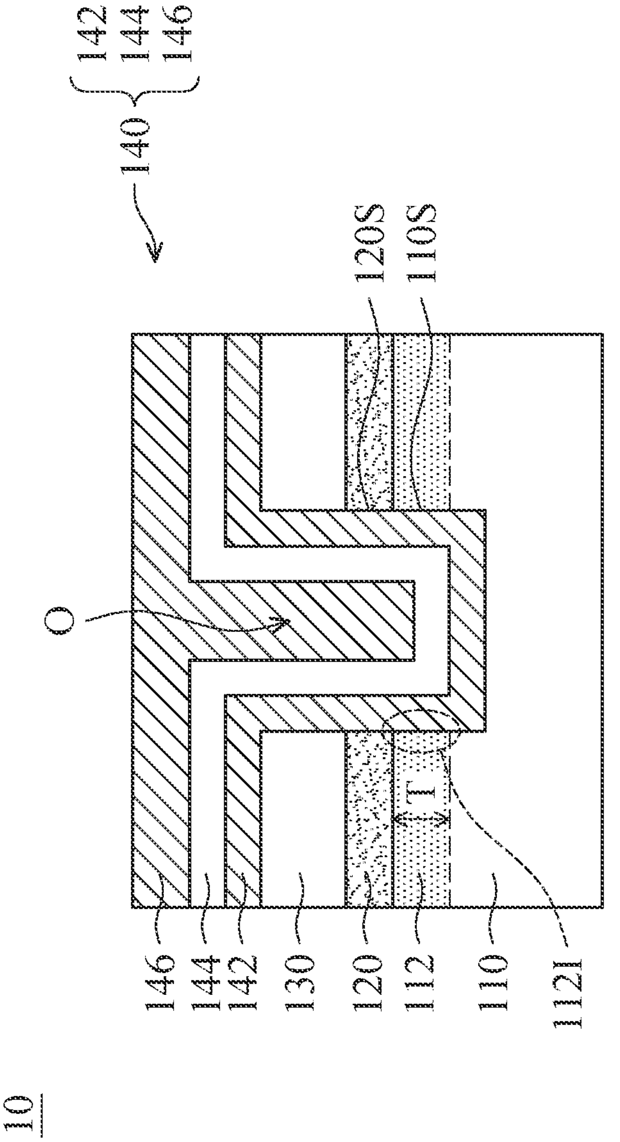
FIG. 1 illustrates a cross-sectional view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms “about”, “approximately”, and “substantially” used herein generally refer to a given value or a range within 20 percent, preferably within 10 percent, and more preferably within 5 percent, within 3 percent, within 2 percent, within 1 percent, or within 0.5 percent. It should be noted that the amounts provided in the specification are approximate amounts, which means that even “about”, “approximate”, or “substantially” are not specified, the meanings of “about”, “approximate”, or “substantially” are still implied.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The term “substantially” as used herein indicates the value of a given quantity that can vary based on a particular technology node associated with the subject semiconductor device. In some embodiments, based on the particular technology node, the term “substantially” can indicate a value of a given quantity that varies within, for example, ±5% of a target (or intended) value.

The present disclosure provides a method for forming a semiconductor structure, which can improve the ohmic contact properties between electrodes (such as source/drain) and two-dimensional electron gas by forming openings with appropriate profiles during the etching process. Specifically, the etching process forms openings that expose substantially vertical sidewalls of a plurality of semiconductor layers, thereby forming an ohmic contact with low contact resistance. In some cases, for example, the above-mentioned semiconductor layers are layers (including, for example, a buffer layer, a channel layer, a barrier layer, etc.) for a subsequently formed high electron mobility transistor (HEMT) element. If the interface between the semiconductor layers and the electrode structure is substantially vertical, the two-dimensional electron gas in the layers will be well distributed near the interface between the semiconductor layers and the electrode structure, and the subsequently deposited electrode material can be deposited well on the sidewalls of the semiconductor layers. In some embodiments, by selecting appropriate etching parameters to increase the depth of the vertical sidewalls, the contact area between the electrode structure and the two-dimensional electron gas can be increased to further reduce the contact resistance between the electrode structure and the two-dimensional electron gas. Therefore, through the method for forming a semiconductor structure disclosed in the present disclosure, a high electron mobility transistor (HEMT) that meets electrical requirements can be formed, and the product yield of the high electron mobility transistor can be improved.

FIG. 1 illustrates a cross-sectional view of a semiconductor structure 10, in accordance with some embodiments of the present disclosure. According to the method for forming the semiconductor structure 10 of the present disclosure, in the beginning, a second semiconductor layer 120 may be formed on a first semiconductor layer 110, and the first semiconductor layer 110 and the second semiconductor layer 120 may have different energy bandgaps. Then, an etching process may be performed to form an opening O exposing a first vertical sidewall 110S of the first semiconductor layer 110 and a second vertical sidewall 120S of the second semiconductor layer 120, respectively. Then, an electrode structure 140 may be formed in the opening O to cover the first vertical sidewall 110S and the second vertical sidewall 120S. According to some embodiments of the present disclosure, features and details of various layers of the semiconductor structure 10 and various stages of the manufacturing process will be further described below.

In some embodiments, the first semiconductor layer 110 and the second semiconductor layer 120 are respectively an electron transport layer and an electron supply layer for a subsequently formed high electron mobility transistor (HEMT). In some embodiments, the first semiconductor layer 110 is formed of $Al_xGa_{1-x}N$, and the second semiconductor layer 120 may be formed of $Al_yGa_{1-y}N$, where x and y satisfy $0 \leq x < y < 1$. In a specific embodiment, for example, the material of the first semiconductor layer 110 is formed of undoped gallium nitride, and the material of the second semiconductor layer 120 is formed of aluminum-doped gallium nitride. In some other embodiments, the first semiconductor layer 110 and the second semiconductor layer 120 include $InxAl_yGa_{1-(x+y)}N$, where $0 \leq x \leq 1$, $0 \leq y \leq 1$, and $x+y \leq 1$. Therefore, the materials of the first semiconductor layer 110 and the second semiconductor layer 120 may include, for example, gallium nitride (GaN), aluminum nitride (AlN), aluminum gallium nitride (AlGaN), aluminum indium nitride (InAlN), indium gallium nitride (InGaN), indium aluminum gallium nitride (InAlGaN), or a combination thereof.

The components of the first semiconductor layer 110 and the second semiconductor layer 120 may be appropriately adjusted so that the energy bandgap of the first semiconductor layer 110 is smaller than the energy bandgap of the second semiconductor layer 120. As a result, referring to FIG. 1, when the semiconductor structure 10 is turned on, two-dimensional electron gas 112 will be generated in the first semiconductor layer 110 and adjacent to the second semiconductor layer 120. That is, the two-dimensional electron gas 112 will be formed near the interface between the first semiconductor layer 110 and the second semiconductor layer 120.

The first semiconductor layer 110 and the second semiconductor layer 120 may be formed by an epitaxial growth process, such as a metal-organic chemical vapor deposition (MOCVD) process, hydride vapor phase epitaxy (HVPE) process, molecular beam epitaxy (MBE) process, other suitable processes, or a combination thereof.

In some embodiments, the thickness of the first semiconductor layer 110 is between about 250 nm and 380 nm, and the thickness of the second semiconductor layer 120 is between about 10 nm and 20 nm, wherein the thickness of the first semiconductor layer 110 is greater than the thickness of the two-dimensional electron gas 112. The thickness T of the two-dimensional electron gas 112 depends on the thickness of the second semiconductor layer 120. For example, in one embodiment, when the thickness of the second semiconductor layer 120 is 10 nm, the thickness of the two-dimensional electron gas 112 is about 7 nm to 10 nm. In another embodiment, when the thickness of the second semiconductor layer 120 is 20 nm, the thickness of the two-dimensional electron gas 112 is about 15 nm to 20 nm.

In some embodiments, the first semiconductor layer 110 is formed on a substrate (not shown). The substrate may be a semiconductor substrate or an insulating substrate, wherein the material of the semiconductor substrate may include: elemental semiconductor, such as silicon or germanium; or compound semiconductor, such as silicon carbide, gallium nitride, aluminum nitride, aluminum gallium nitride, or a combination thereof. The material of the insulating substrate may include sapphire or other suitable materials. The substrate may also be a multi-layered substrate, such as a silicon-on-insulator (SOI) substrate. Although not illustrated, a nucleation layer may also be formed on the substrate to improve the epitaxial quality of subsequently formed layers (e.g., the first semiconductor layer 110 and the second semiconductor layer 120).

In addition, in some embodiments, a buffer layer is formed between the substrate and the first semiconductor layer 110, thereby reducing the strain caused by the lattice mismatch between the substrate and the first semiconductor layer 110, which prevents defects from being formed in the first semiconductor layer 110. The material of the buffer layer 102 includes aluminum nitride (AlN), gallium nitride (GaN), aluminum gallium nitride (AlGaN), other suitable materials, or a combination thereof. The buffer layer 102 may be formed by an epitaxial growth process, such as a metal organic chemical vapor deposition (MOCVD) process, a hydride vapor phase epitaxy (HVPE) process, a molecular beam epitaxy (MBE) process, other suitable processes, or a combination thereof.

Then, after forming the first semiconductor layer 110 and the second semiconductor layer 120, the passivation layer 130 covering the top surface of the second semiconductor layer 120 may be formed on the second semiconductor layer 120. The passivation layer 130 can protect the portions of the first semiconductor layer 110 and the second semiconductor layer 120 directly below the passivation layer 130 during subsequent etching processes. Furthermore, in some embodiments, the passivation layer 130 can be used to passivate the top surface of the second semiconductor layer 120, thereby significantly suppressing the current breakdown effect and reducing surface leakage current. In some embodiments, the thickness of the passivation layer 130 is between about 65 nm and 300 nm, such as about 100 nm.

The material of the passivation layer 130 may include oxide, nitride, oxynitride, other suitable materials, or a combination thereof. For example, in a specific embodiment, silicon nitride is used as the material of the passivation layer 130. The method used to form the passivation layer 130 may include a metal organic chemical vapor deposition (MOCVD) process, a hydride vapor phase epitaxy (HVPE) process, a molecular beam epitaxy (MBE) process, other suitable methods, or a combination thereof.

Then, referring to FIG. 1, an etching process can be performed on the second semiconductor layer 120 and the first semiconductor layer 110 to form the second vertical sidewall 120S and the first vertical sidewall 110S exposed in the opening O, respectively. Here, the term "vertical" means that the first vertical sidewall 110S and the second vertical sidewall 120S are substantially perpendicular to the horizontal direction of the semiconductor structure 10, such as the horizontal direction in FIG. 1. In some embodiments, the first vertical sidewall 110S and the second vertical sidewall 120S are substantially perpendicular to the bottom surface of the opening O. In some embodiments, as shown in FIG. 1, the first vertical sidewall 110S extends from the bottom surface of the opening O to a junction of the first semiconductor layer 110 and the second semiconductor layer 120, and the second vertical sidewall 120S extends from the junction to the top surface of the second semiconductor layer 120.

The etching process of the first semiconductor layer 110 and the second semiconductor layer 120 may be performed through anisotropic etching. For example, the etching process may include dry etching, such as reactive ion etching (RIE). In addition, the etching process may be performed in a low pressure environment, for example, at a pressure of about 10 to 50 mtorr. In some embodiments, the first semiconductor layer 110 and the second semiconductor layer 120 are etched under a power of 500 W to 1000 W, and the etching time may be between about 25 seconds and 60 seconds. The etchant used in the etching process may include $CHF_3$, $C_4F_8$, $CF_4$, $Cl_2$, other suitable etchants, or a combination thereof. For example, in a specific embodiment, $CHF_3$ is used as an etchant and a radio frequency power of more than 500 W is applied to etch the first semiconductor layer 110 and the second semiconductor layer 120, which can form the first vertical sidewall 110S and the second vertical sidewall 120S with tilt angles close to 90°. It should be understood that the so-called "tilt angle" here refers to the angle between the sidewall of a specific layer and the horizontal direction of the semiconductor structure 10. In the case where the opening O has a flat bottom, the "tilt angle" may also refer to the angle between the sidewall of the specific layer and the bottom of the opening O.

A mask layer (not shown) may be further formed over the second semiconductor layer 120 (e.g., on the top surface of the passivation layer 130) before performing the etching process. In some embodiments, the mask layer is formed of dielectric materials, including: organic materials, such as photoresist materials (such as Su8), benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, or fluorocarbon polymer; inorganic materials, such as silicone, glass, alumina ($Al_2O_3$), silicon nitride ($SiN_x$), silicon oxide ($SiO_x$), titanium oxide ($TiO_x$), or magnesium fluoride ($MgF_x$).

The formation of the mask layer may include utilizing a lithography process to pattern the material for the mask layer. The lithography process may include photoresist coating (e.g., spin coating), soft baking, mask alignment, exposure, post-exposure baking, photoresist development, rinsing, drying (e.g., spin-drying and/or hard baking), other suitable lithography steps, and/or a combination thereof.

In the etching process, the passivation layer 130, the second semiconductor layer 120, and the first semiconductor layer 110 may be etched sequentially. By using appropriate etchant and etching parameters, the passivation layer 130, the second semiconductor layer 120, and the first semiconductor layer 110 can be etched with the same etchant. That is, a common equipment can be used to etch the materials of the passivation layer 130, the second semiconductor layer 120, and the first semiconductor layer 110.

After the opening O is formed, the electrode structure 140 may be formed in the opening O to cover the first vertical sidewall 110S and the second vertical sidewall 120S. As shown in FIG. 1, the electrode structure 140 may be in direct contact with the first vertical sidewall 110S. The electrode structure 140 may form ohmic contact with the two-dimensional electron gas 112 at the interface 112I. In some embodiments, the electrode structure 140 is the source or drain of semiconductor structure 10. Therefore, current can be conducted from the electrode structure 140 laterally located on one side of the two-dimensional electron gas 112 to the source or drain on the other side via the two-dimensional electron gas 112. In some embodiments, as shown in FIG. 1, in addition to the opening O, the electrode structure 140 further extends to directly above the first semiconductor layer 110, the second semiconductor layer 120, and the passivation layer 130.

The electrode structure 140 may be formed as a multilayer structure. For example, referring to FIG. 1, the formation of the electrode structure 140 may include conformally forming a bottom metal layer 142 in the opening O. The bottom metal layer 142 may include a conductive material with low resistance, such as metal, metal compound, or a combination thereof. For example, the metal includes gold, nickel, platinum, palladium, iridium, titanium, chromium, tungsten, aluminum, copper, silver, alloys or multilayer structures of the foregoing metals, or combinations thereof; the metal compound include, for example, titanium nitride. The formation method of the bottom electrode layer 142 may include physical vapor deposition (PVD), chemical vapor deposition (CVD), atomic layer deposition (ALD), electron beam evaporation, electroplating, other suitable methods, or a combination thereof. The thickness of the bottom electrode layer 142 is between approximately 150 nm and 300 nm.

In some embodiments, the formation of the electrode structure 140 further includes sequentially forming an inter-metal dielectric layer 144 and a top metal layer 146 on the bottom metal layer 142. The material of the inter-metal dielectric layer 144 may include silicon nitride, silicon oxide, silicon oxynitride, aluminum oxide, other suitable materials, or a combination thereof. The formation method of the inter-metal dielectric layer 144 may include physical vapor deposition (PVD), chemical vapor deposition (CVD), atomic layer deposition (ALD), other suitable methods, or a combination thereof. The material and formation method of the top metal layer 146 may be similar to those of the bottom metal layer 142, and detailed description thereof is omitted here for the sake of brevity. In some embodiments, the thickness of top electrode layer 146 is greater than the thickness of bottom electrode layer 142. By further forming the inter-metal dielectric layer 144 and the top metal layer 146, compared to the electrode structure 140 in which only the bottom electrode layer 142 is formed with a thinner thickness, the property of the electrode structure 140 for withstanding high-voltage can be improved, and the ohmic contact of the semiconductor structure 10 can be further improved. However, in some other embodiments, the inter-metal dielectric layer 144 and the top metal layer 146 may not be formed on the conformal bottom electrode layer 142, and the voltage may be applied directly to the first semiconductor layer 110 and the second semiconductor layer 120 through the bottom electrode layer 142.

In some embodiments, each inclination angle of the first vertical side wall 110S and the second vertical side wall 120S is between 85° and 95°. By forming the first vertical sidewall 110S and the second vertical sidewall 120S to have substantially vertical sidewalls, the two-dimensional electron gas 112 in the first semiconductor layer 110 can also be well distributed near the interface 112I between the first semiconductor layer 110 and the electrode structures 140. In some embodiments, as shown in FIGS. 1 and 2A, the first vertical sidewall 110S and the second vertical side wall 120S have the same inclination angle. In some further embodiments, the side surface of the passivation layer 130 has the same inclination angle as the first vertical sidewall 110S and the second vertical sidewall 120S.

The influence of the inclination angles of the first vertical sidewall 110S and the second vertical sidewall 120S on the performance of the semiconductor structure 10 will be described below with reference to FIGS. 2A and 2B. For the sake of simplicity, only the bottom electrode layer 142 in the electrode structure 140 is shown in FIGS. 2A and 2B and the inter-metal dielectric layer 144 and the top electrode layer 146 which may be omitted are not shown.

FIG. 2A illustrates a local cross-sectional view of the semiconductor structure 10, in accordance with some embodiments of the present disclosure. In the semiconductor structure 10 of the present disclosure, the first semiconductor layer 110 and the second semiconductor layer 120 respectively have the first vertical sidewall 110S and second vertical sidewall 120S that are substantially vertical, so that the contact resistance is lower at the interface 112I between the bottom electrode layer 142 and the two-dimensional electron gas 112. Specifically, since the inclination angles of the first vertical sidewall 110S and the second vertical sidewall 120S are close to 90°, the two-dimensional electron gas 112 can have a uniform electron concentration in the horizontal direction of the semiconductor structure 10, such that the two-dimensional electron gas 112 can have a sufficient electron concentration near the interface 112I adjacent to the electrode structure (e.g., the interface between the two-dimensional electron gas 112 and the bottom electrode layer 142). Since the bottom electrode layer 142 can be electrically connected to the two-dimensional electron gas 112 with a higher electron concentration over a larger area, the semiconductor structure 10 of the present disclosure has better ohmic contact properties.

Figure 2B:
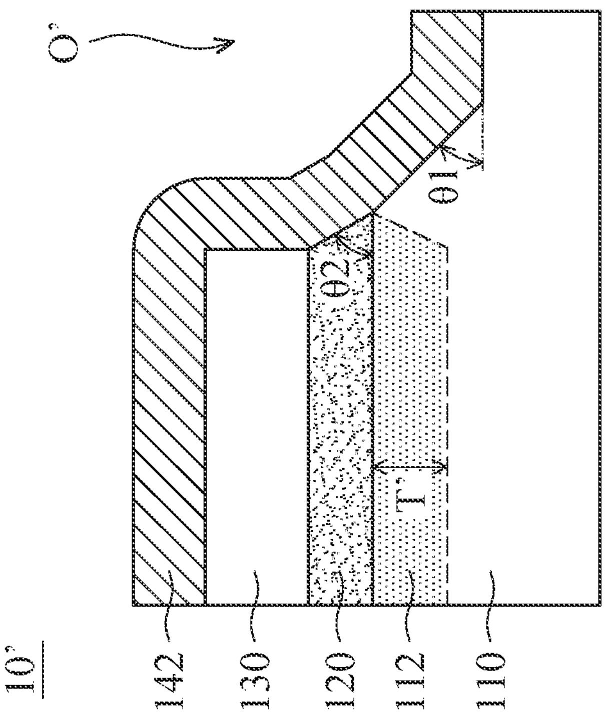
FIG. 2B illustrates a local cross-sectional view of a semiconductor structure without good ohmic contact between the electrode structure and the two-dimensional electron gas, in accordance with some conventional manufacturing processes of the semiconductor structure.
Figure 2A:
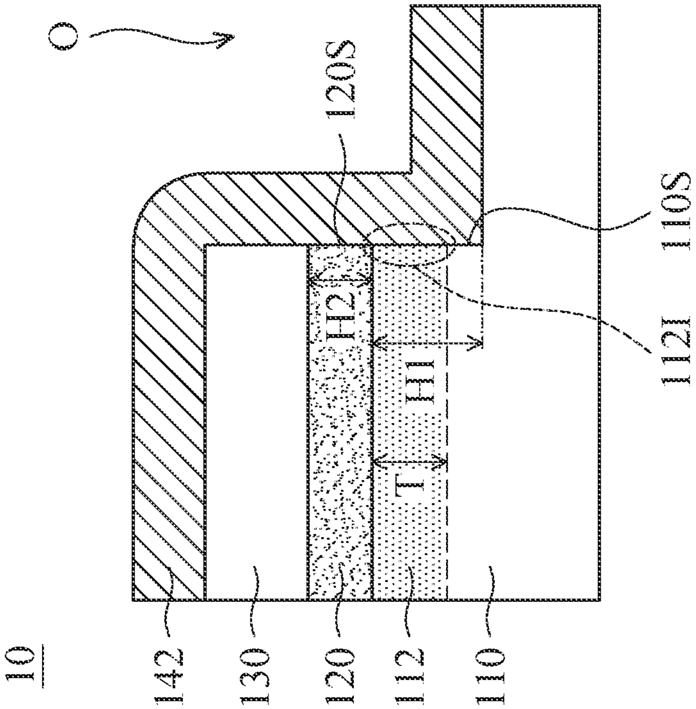
FIG. 2A illustrates a local cross-sectional view of the semiconductor structure, in accordance with some embodiments of the present disclosure.

Compared to this, FIG. 2B illustrates a local cross-sectional view of a semiconductor structure 10' without good ohmic contact between the electrode structure and the two-dimensional electron gas, in accordance with some conventional manufacturing processes of the semiconductor structure 10'. An electrode structure including a bottom electrode layer 142 is formed in the opening O' left after etching the first semiconductor layer 110 and the second semiconductor layer 120. In addition, the sidewalls of the first semiconductor layer 110 and the second semiconductor layer 120 of the semiconductor structure 10' respectively have inclination angles θ1 and θ2, and θ1 and θ2 are less than 85°.

As shown in FIG. 2B, since the inclination angle θ2 of the sidewall of the second semiconductor layer 120 is less than 85°, the thickness of the portion of the second semiconductor layer 120 adjacent to the bottom electrode layer 142 becomes thinner gradually. Therefore, the ability of the second semiconductor layer 120 to supply electrons to the underlying first semiconductor layer 110 will be weakened near the bottom electrode layer 142, so that the electron concentration of the two-dimensional electron gas 112 near the bottom electrode layer 142 is lower, and the thickness T' of the two-dimensional electron gas 112 in the vertical direction is also significantly reduced adjacent to the bottom electrode layer 142. That is, the two-dimensional electron gas 112 in the semiconductor structure 10' cannot have a uniform electron concentration in the horizontal direction of the semiconductor structure 10'. In addition, since the inclination angle θ1 of the sidewall of the first semiconductor layer 110 is less than 85°, the electron concentration near the interface between the first semiconductor layer 110 and the bottom electrode layer 142 becomes lower, making it difficult for the electrode structure to form a good ohmic contact with the two-dimensional electron gas 112.

Even if one of the first semiconductor layer 110 and the second semiconductor layer 120 has a vertical sidewall and the other has an inclination angle less than, for example, 85°, compared with the semiconductor structure 10 of the present disclosure, the two-dimensional electron gas 112 of the semiconductor structure 10' cannot have a sufficiently uniform electron concentration in the horizontal direction of the semiconductor structure 10'. Therefore, in such a case, the contact resistance between the electrode structure and the two-dimensional electron gas 112 will also be higher than the contact resistance at the interface 112I of the semiconductor structure 10 of the present disclosure.

In some other semiconductor structures of prior art (not shown in the drawings), the sidewall of the first semiconductor layer 110 and/or the second semiconductor layer 120 is not a vertical sidewall, and the inclination angle θ1 and/or θ2 is greater than, for example, 95°. That is, the lateral ends of the first semiconductor layer 110 and the second semiconductor layer 120 have undercut structures. In such a case, it will be difficult for the material of the electrode structure 140 to be well deposited on the sidewall of the first semiconductor layer 110 and/or the second semiconductor layer 120. As a result, gaps may be formed between the electrode structure 140 and the first semiconductor layer 110 and/or the second semiconductor layer 120, resulting in poor ohmic contact properties of the semiconductor structure.

As described above, by forming the first vertical sidewall 110S and the second vertical sidewall 120S that are substantially perpendicular to the horizontal direction of the semiconductor structure 10, the electrode structure 140 can form a good electrical contact with the two-dimensional electron gas 112, which can provide a lower contact resistance. Therefore, through the method of forming a semiconductor structure of the present disclosure, a high electron mobility transistor (HEMT) that meets electrical requirements can be formed, and the product yield of a high electron mobility transistor can be improved.

In addition to the inclination angles of the first vertical sidewall 110S and the second vertical sidewall 120S, the height H1 of the first vertical sidewall 110S and the thickness of the second semiconductor layer 12 will also affect the properties of the ohmic contact of the semiconductor structure 10, as discussed below.

The height H1 of the first vertical sidewall 110S and the height H2 of the second vertical sidewall 120S may depend on the depth of the opening O formed during the etching process and the thickness of the second semiconductor layer 120, respectively. In some embodiments, the thickness of the second semiconductor layer 120 is equal to the height H2 of the second vertical sidewall 120S. In some embodiments, the depth of the opening O is the sum of the height H1, the height H2, and the thickness of the passivation layer 130. If the thickness of the second semiconductor layer 120 is thicker, the second semiconductor layer 120 will be able to supply more electrons to the two-dimensional electron gas 112 below. As a result, the two-dimensional electron gas 112 has a higher concentration and a thicker thickness, which improves the ohmic contact properties of the interface 112I. If the height H1 of the first vertical sidewall 110S is greater, the electrode structure 140 will be able to electrically connect with the two-dimensional electron gas 112 with a larger contact area, so that the contact resistance at the interface 112I is reduced and the performance of the semiconductor structure 10 is improved. In some embodiments, as shown in FIG. 2A, the height H1 of the first vertical sidewall 110S is greater than the thickness T of the two-dimensional electron gas 112.

Figure 3:
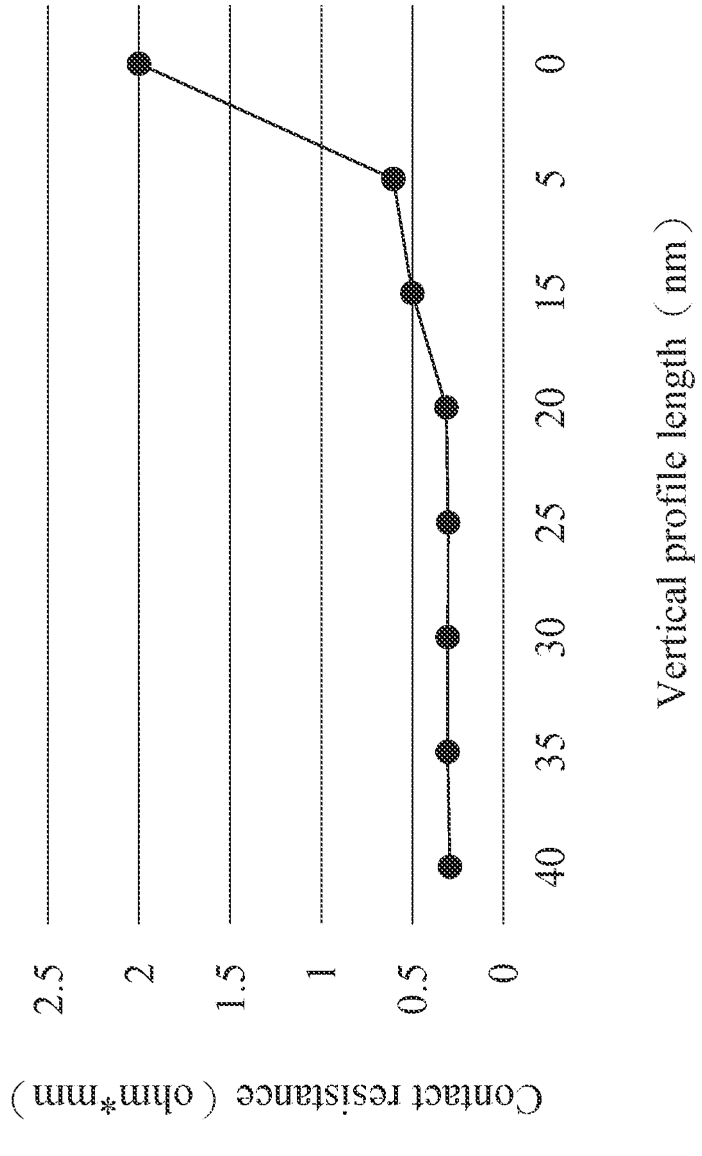
FIG. 3 illustrates a graph showing the relationship between the vertical profile length and the contact resistance of the semiconductor structure, in accordance with some embodiments of the present disclosure.

FIG. 3 illustrates a graph showing the relationship between the vertical profile length and the contact resistance of the semiconductor structure 10, in accordance with some embodiments of the present disclosure. The so-called vertical profile means that the inclination angles of the first vertical sidewall 110S and the second vertical sidewall 120S are substantially 90°, and the term "vertical profile length" may refer to the sum of the height H1 of the first vertical sidewall 110S and the height H2 of the second vertical sidewall 120S. By selecting appropriate etchants and etching parameters for the etching process of the opening O, as shown in FIG. 3, the sum of the heights of the first vertical sidewall 110S and the second vertical sidewall 120S may be greater than 20 nm. In some embodiments, by using, for example, $CHF_3$ as an etchant, the first semiconductor layer 110 and the second semiconductor layer 120 can be anisotropically etched to be substantially vertical and have a longer vertical profile. For example, there may be a vertical profile of about 40 nm, for example. Furthermore, the relationship between the vertical profile length and contact resistance shown in FIG. 3 was measured with the semiconductor structure 10 in which the electrode structure 140 only includes the conformal bottom electrode layer 142. It should be understood that the contact resistance ($R_C$) is measured by measuring the ohmic resistance value at different gate distances, rather than by changing the applied voltage and measuring the ohmic resistance value. In addition, the measured ohmic resistance value is the sum of the sheet resistance ($R_S$) from the two-dimensional electron gas 112 and the contact resistance ($R_C$) from the interface 112I. Based on the relationship between the change in gate distance and the measured ohmic resistance value, the value of the contact resistance ($R_C$) can be calculated.

As shown in FIG. 3, the contact resistance between the electrode structure 140 and the two-dimensional electron gas 112 decreases as the vertical profile length increases. When the vertical profile length increases to about 20 nm, the contact resistance between the electrode structure 140 and the two-dimensional electron gas 112 is less than 0.5 ohm*mm. In conventional semiconductor structures in which the semiconductor layer does not have substantially vertical sidewalls or the vertical profile is less than 20 nm, only contact resistance above 0.5 ohm*mm can be measured. Therefore, the semiconductor structure 10 of the present disclosure can improve the ohmic contact properties of the interface between the electrode structure 140 and the two-dimensional electron gas 112.

In other embodiments of the present disclosure, measurement is performed on the semiconductor structure 10 in which the electrode structure 140 further includes the inter-metal dielectric layer 144 and the top electrode layer 146, which can further reduce the contact resistance between the electrode structure 140 and the two-dimensional electron gas 112. For example, when the vertical profile length increases to more than 20 nm, the contact resistance between the electrode structure 140 and the two-dimensional electron gas 112 may be less than 0.3 ohm*mm.

It can be understood that by selecting appropriate etchants and etching parameters for the etching process of the opening O to increase the vertical profile length of the semiconductor structure 10, the contact area between the electrode structure 140 and the two-dimensional electron gas 112 can be increased to further reduce the contact resistance at the interface 112I.

In summary, the present disclosure provides a method for forming a semiconductor structure, which can improve the ohmic contact properties between electrodes (such as source/drain) and two-dimensional electron gas by forming openings with appropriate profiles during the etching process. Specifically, the etching process forms openings that expose substantially vertical sidewalls of a plurality of semiconductor layers, thereby forming an ohmic contact with low contact resistance. In some cases, for example, the above-mentioned semiconductor layers are layers (including, for example, a buffer layer, a channel layer, a barrier layer, etc.) for a subsequently formed high electron mobility transistor (HEMT) element. If the interface between the semiconductor layers and the electrode structure is substantially vertical, the two-dimensional electron gas in the layers will be well distributed near the interface between the semiconductor layers and the electrode structure, and the subsequently deposited electrode material can be deposited well on the sidewalls of the semiconductor layers. In some embodiments, by selecting appropriate etching parameters to increase the depth of the vertical sidewalls, the contact area between the electrode structure and the two-dimensional electron gas can be increased to further reduce the contact resistance between the electrode structure and the two-dimensional electron gas. Therefore, through the method for forming a semiconductor structure disclosed in the present disclosure, a high electron mobility transistor (HEMT) that meets electrical requirements can be formed, and the product yield of the high electron mobility transistor can be improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a second semiconductor layer on a first semiconductor layer, wherein the first semiconductor layer and the second semiconductor layer have different energy bandgaps;

performing an etching process to form an opening exposing a first vertical sidewall of the first semiconductor layer and a second vertical sidewall of the second semiconductor layer; and forming an electrode structure in the opening to cover the first vertical sidewall and the second vertical sidewall, wherein the method further comprises forming a passivation layer on the second semiconductor layer covering a top surface of the second semiconductor layer;

wherein the formation of the electrode structure comprises conformally forming a bottom metal layer in the opening and sequentially forming an inter-metal dielectric layer and a top metal layer on the bottom metal layer;

wherein the inter-metal dielectric layer comprises an electrically insulating material and is interposed between the bottom metal layer and the top metal layer; and wherein each of the bottom metal layer, the inter-metal dielectric layer, and the top metal layer has a continuous portion extending from inside the opening along a side surface of the passivation layer and onto a top surface of the passivation layer.

2. The method as claimed in claim 1, wherein each inclination angle of the first vertical sidewall and the second vertical sidewall is between 85° and 95°.

3. The method as claimed in claim 1, wherein the first vertical sidewall and the second vertical sidewall have the same inclination angle.

4. The method as claimed in claim 1, wherein a sum of heights of the first vertical sidewall and the second vertical sidewall is greater than 20 nm.

5. The method as claimed in claim 1, wherein the electrode structure is in direct contact with the first vertical sidewall.

6. The method as claimed in claim 1, wherein the first vertical sidewall extends from a bottom surface of the opening to a junction of the first semiconductor layer and the second semiconductor layer, and the second vertical sidewall extends from the junction to a top surface of the second semiconductor layer.

7. The method as claimed in claim 1, wherein a two-dimensional electron gas (2DEG) is generated in the first semiconductor layer and adjacent to the second semiconductor layer.

8. The method as claimed in claim 7, wherein the electrode structure forms an ohmic contact with the two-dimensional electron gas.

9. The method as claimed in claim 8, wherein contact resistance between the electrode structure and the two-dimensional electron gas is lower than 0.5 ohm*mm.

10. The method as claimed in claim 7, wherein height of the first vertical sidewall is greater than thickness of the two-dimensional electron gas.

11. The method as claimed in claim 7, wherein the two-dimensional electron gas has a uniform electron concentration in a horizontal direction.

12. The method as claimed in claim 1, wherein the passivation layer, the second semiconductor layer, and the first semiconductor layer are sequentially etched in the etching process, and the passivation layer, the second semiconductor layer, and the first semiconductor layer are etched with the same etchant.

13. The method as claimed in claim 1, wherein a side surface of the passivation layer has the same inclination angle as the first vertical sidewall and the second vertical sidewall.

14. The method as claimed in claim 1, wherein an etchant used in the etching process comprises $CHF_3$, $C4F_8$, $CF_4$, or $Cl_2$.

15. The method as claimed in claim 1, wherein the electrode structure is a source or a drain of the semiconductor structure.

16. The method as claimed in claim 1, wherein the energy bandgap of the first semiconductor layer is smaller than the energy bandgap of the second semiconductor layer.

17. The method as claimed in claim 1, wherein the first semiconductor layer is formed of undoped gallium nitride, and the second semiconductor layer is formed of aluminum-doped gallium nitride.

* * * * *